United States Patent
Hara et al.

(10) Patent No.: US 11,889,632 B2
(45) Date of Patent: Jan. 30, 2024

(54) FEEDER AND COMPONENT MOUNTING MACHINE

(71) Applicant: FUJI CORPORATION, Chiryu (JP)

(72) Inventors: Akira Hara, Toyohashi (JP); Yuichi Shimamoto, Toyoake (JP)

(73) Assignee: FUJI CORPORATION, Chiryu (JP)

( * ) Notice: Subject to any disclaimer, the term of this patent is extended or adjusted under 35 U.S.C. 154(b) by 41 days.

(21) Appl. No.: 17/635,288

(22) PCT Filed: Sep. 13, 2019

(86) PCT No.: PCT/JP2019/036189
§ 371 (c)(1),
(2) Date: Feb. 14, 2022

(87) PCT Pub. No.: WO2021/049025
PCT Pub. Date: Mar. 18, 2021

(65) Prior Publication Data
US 2022/0295678 A1  Sep. 15, 2022

(51) Int. Cl.
*H05K 13/02* (2006.01)
*H05K 13/04* (2006.01)
*H05K 13/08* (2006.01)

(52) U.S. Cl.
CPC ....... *H05K 13/022* (2013.01); *H05K 13/0419* (2018.08); *H05K 13/087* (2018.08)

(58) Field of Classification Search
CPC ............. H05K 13/0419; H05K 13/022; H05K 13/082; H05K 13/087
See application file for complete search history.

(56) References Cited

U.S. PATENT DOCUMENTS

| 2010/0242267 A1 | 9/2010 | Tsukagoshi |
| 2013/0326867 A1 | 12/2013 | Uesugi et al. |

(Continued)

FOREIGN PATENT DOCUMENTS

| CN | 103491759 A | 1/2014 |
| CN | 107645901 A | 1/2018 |

(Continued)

OTHER PUBLICATIONS

Yamada et al., "A Novel Chip Placement Technology for Fan-Out WLP using Self-Assembly Technique with Porous Chuck Table," 2021 IEEE 71st Electronic Components and Technology Conference (ECTC), San Diego, CA, USA, 2021, pp. 1088-1094. (Year: 2021).*

(Continued)

*Primary Examiner* — A. Dexter Tugbang
(74) *Attorney, Agent, or Firm* — Oblon, McClelland, Maier & Neustadt, L.L.P.

(57) ABSTRACT

A feeder includes a sprocket that feeds a tape accommodating multiple components; a motor that rotates the sprocket; a storage section to store the rotational position of the sprocket detected by a sensor as an initial rotational position when the tape is set in the feeder and store a cumulative feeding amount of the tape fed by the rotation of the sprocket; and a control section to control the motor such that the sprocket rotates in a forward direction based on a feeding amount of the tape required for a supply when supplying the components to the component mounting machine, and control the motor such that the sprocket does not rotate in a reverse direction in excess of the initial rotational position based on the initial rotational position and the cumulative feeding amount when rewinding the tape.

4 Claims, 9 Drawing Sheets

(56) References Cited

U.S. PATENT DOCUMENTS

2019/0307033 A1 10/2019 Takagi et al.
2020/0267879 A1  8/2020 Asao et al.

FOREIGN PATENT DOCUMENTS

| EP | 2 059 111 | | 5/2009 | |
|----|-----------|---|--------|---|
| EP | 2 672 800 A2 | | 12/2013 | |
| JP | 2002198691 A | * | 7/2002 | ......... H05K 13/0417 |
| JP | 2008-53381 A | | 3/2008 | |
| JP | 2013098382 A | * | 5/2013 | ......... H05K 13/0419 |
| JP | 2013-254895 A | | 12/2013 | |
| JP | 2018-14436 A | | 1/2018 | |
| WO | WO 2018/109793 A1 | | 6/2018 | |
| WO | WO 2019/058562 A1 | | 3/2019 | |

OTHER PUBLICATIONS

International Search Report dated Dec. 10, 2019 in PCT/JP2019/036189 filed on Sep. 13, 2019 (2, pages).

* cited by examiner

Fig. 9
Fig. 9A
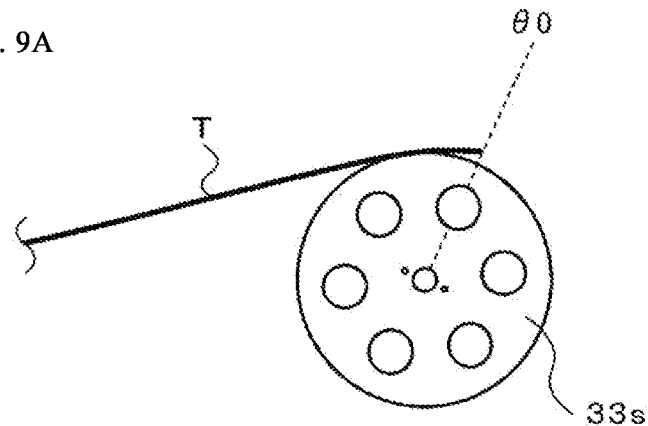
Fig. 9B
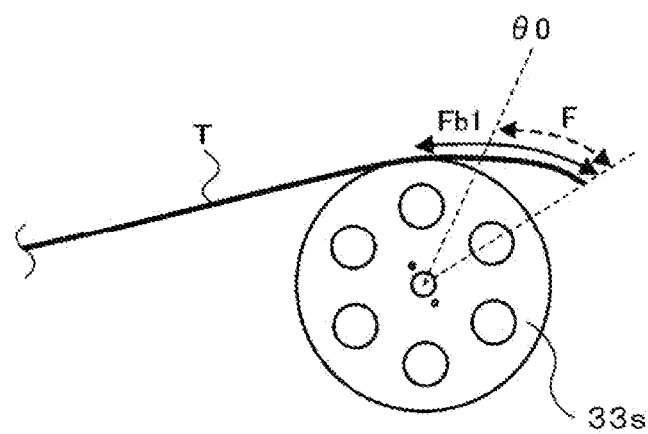
Fig. 9C
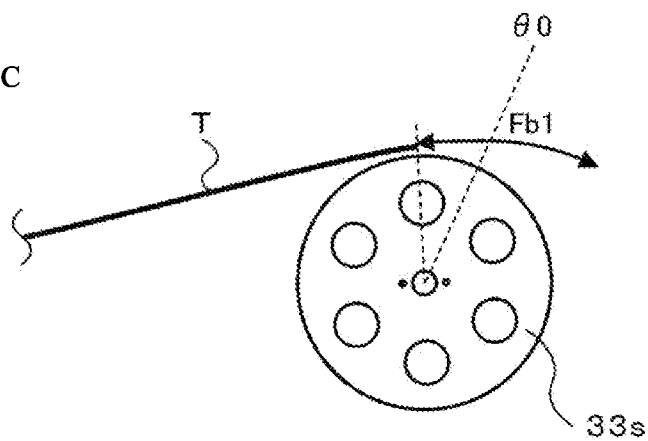

Fig. 10
Fig. 10A
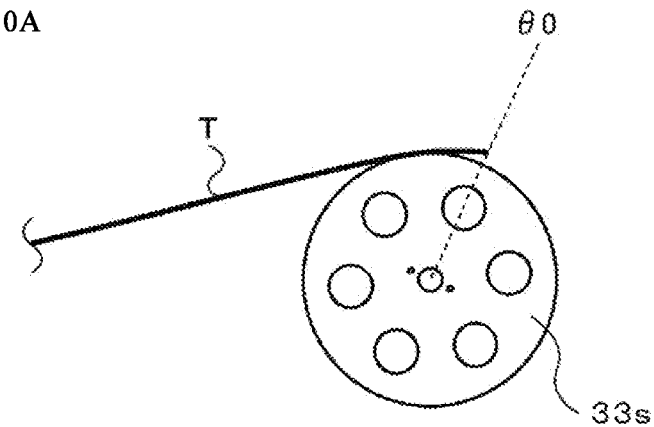
Fig. 10B
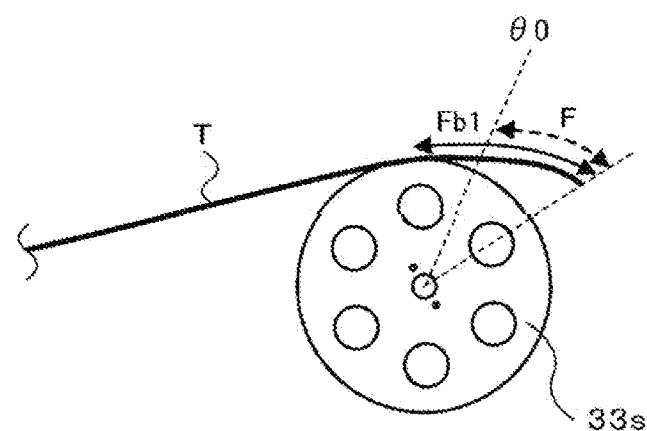
Fig. 10C
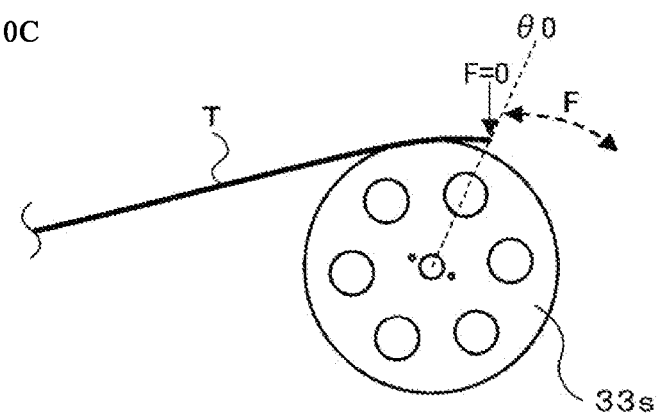

FEEDER AND COMPONENT MOUNTING MACHINE

TECHNICAL FIELD

The present specification discloses a feeder and a component mounting machine.

BACKGROUND ART

Conventionally, as such type of a feeder, a feeder in which, when detaching a feeder from a component mounting machine for exchanging due to a component shortage or a failure and the like, an empty tape hanging down from the front direction is rewound by rotating a feed motor of the feeder in the reverse direction to rotate a sprocket in the reverse direction, has been proposed (refer to, for example, Patent Literature 1). In the feeder, by making a state such that the empty tape does not hang down by rewinding the empty tape by a predetermined amount, a hanging portion is prevented from being caught when the feeder is attached next time.

PATENT LITERATURE

Patent Literature 1: JP-A-2013-254895

BRIEF SUMMARY

Technical Problem

However, in the Patent Literature 1, a case where a feeder in which a new tape is set in the sprocket is attached to the component mounting machine, and is detached from the component mounting machine before the tape is sufficiently fed out, is not taken into consideration. In that case, when the empty tape is uniformly rewound by a predetermined amount as described above, there is a problem in that the feeder may be removed from the sprocket. When the feeder is reattached to the component mounting machine in a state of being removed from the sprocket, since the tape cannot be fed and an error occurs, production will be stopped and an operator needs to set the tape in the sprocket.

A main object of the present disclosure is to prevent the tape from being removed from the sprocket when rewinding the tape.

Solution to Problem

The present disclosure has taken following means to achieve the main object described above.

A feeder in the present disclosure is a feeder including a sprocket that feeds a tape accommodating multiple components and a motor that rotates the sprocket, and is detachably attached to a component mounting machine, the feeder includes: a sensor configured to detect a rotational position of the sprocket; a storage section configured to store the rotational position of the sprocket detected by the sensor as an initial rotational position when the tape is set in the feeder with engagement to the sprocket and store a cumulative feeding amount of the tape fed by the rotation of the sprocket; and a control section configured to control the motor such that the sprocket rotates in a forward direction based on a feeding amount of the tape required for a supply when supplying the components to the component mounting machine, and control the motor such that the sprocket does not rotate in a reverse direction in excess of the initial rotational position based on the initial rotational position and the cumulative feeding amount when rewinding the tape.

The feeder in the present disclosure stores the rotational position of the sprocket detected by the sensor as an initial rotational position when the tape is set in the feeder with engagement to the sprocket and store a cumulative feeding amount of the tape fed by the rotation of the sprocket. In addition, the feeder controls the motor such that the sprocket does not rotate in the reverse direction in excess of the initial rotational position based on the initial rotational position and a cumulative feeding amount when rewinding the tape. As a result, when rewinding the tape when the cumulative feeding amount is small, since the sprocket does not exceed the initial rotational position, it is possible to prevent the tape from being removed from the sprocket.

BRIEF DESCRIPTION OF DRAWINGS

FIG. 9 is an explanatory diagram showing a state in which return is performed by predetermined return amount Fb1 in a comparison example.

FIG. 10 is an explanatory diagram showing a state in which return is performed by cumulative feeding amount F in the present embodiment.

DESCRIPTION OF EMBODIMENTS

Next, an embodiment of the present disclosure will be described with reference to the drawings.

Figure 1:
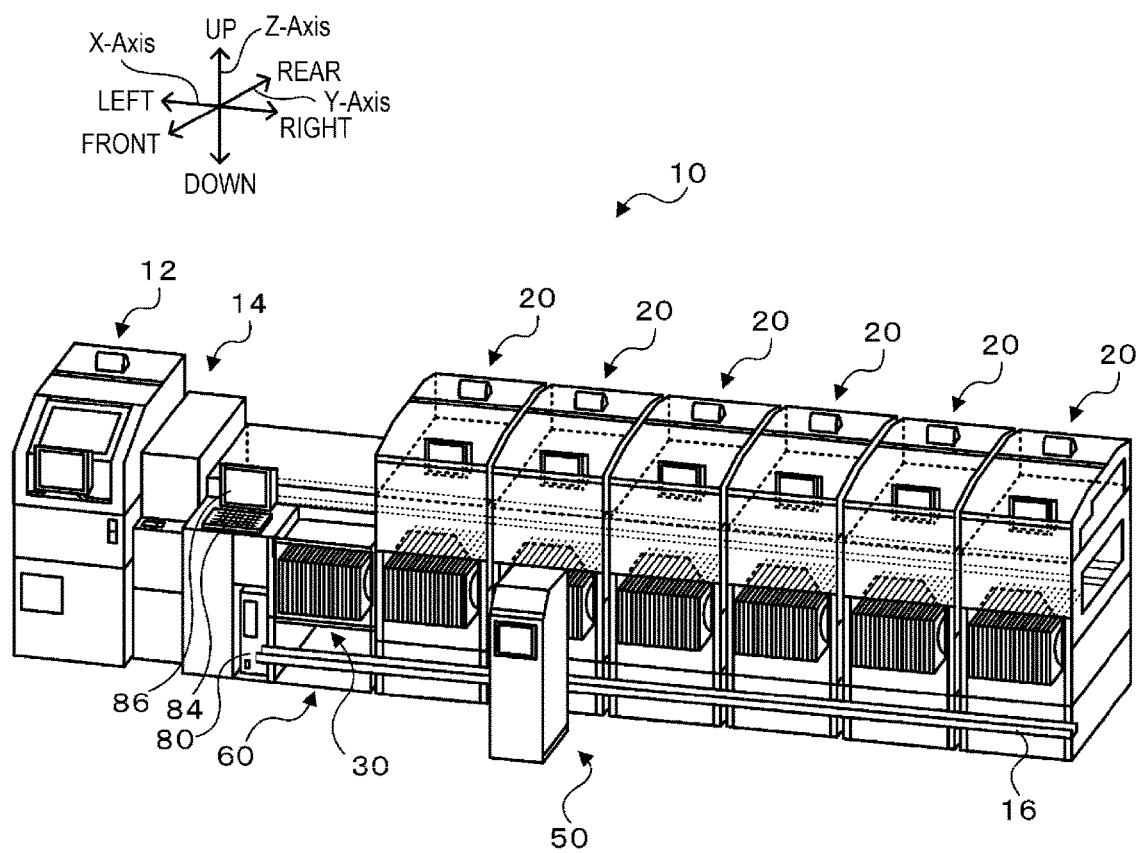
FIG. 1 is an appearance perspective view of component mounting system 10.
Figure 2:
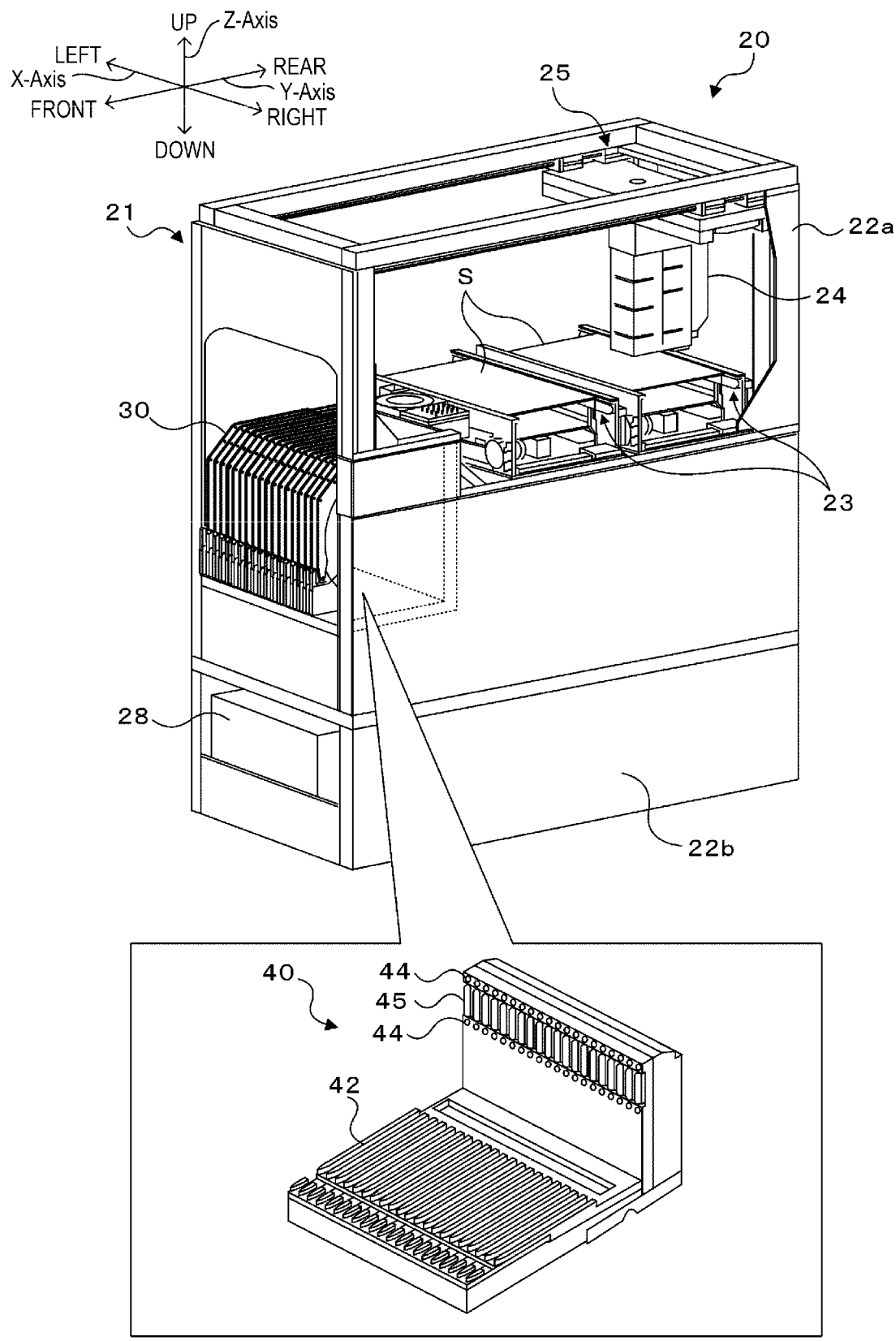
FIG. 2 is a schematic configuration diagram of component mounting machine 20.
Figure 3:
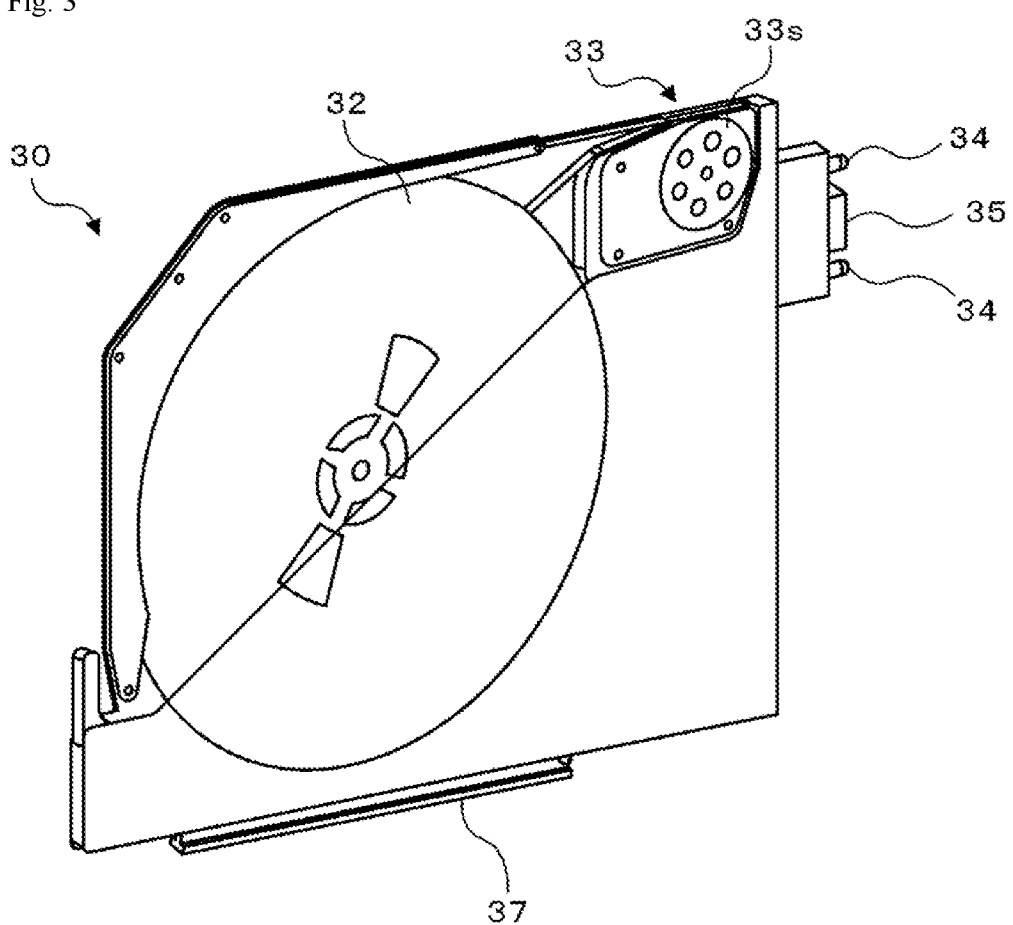
FIG. 3 is an appearance perspective view of feeder 30.
Figure 4:
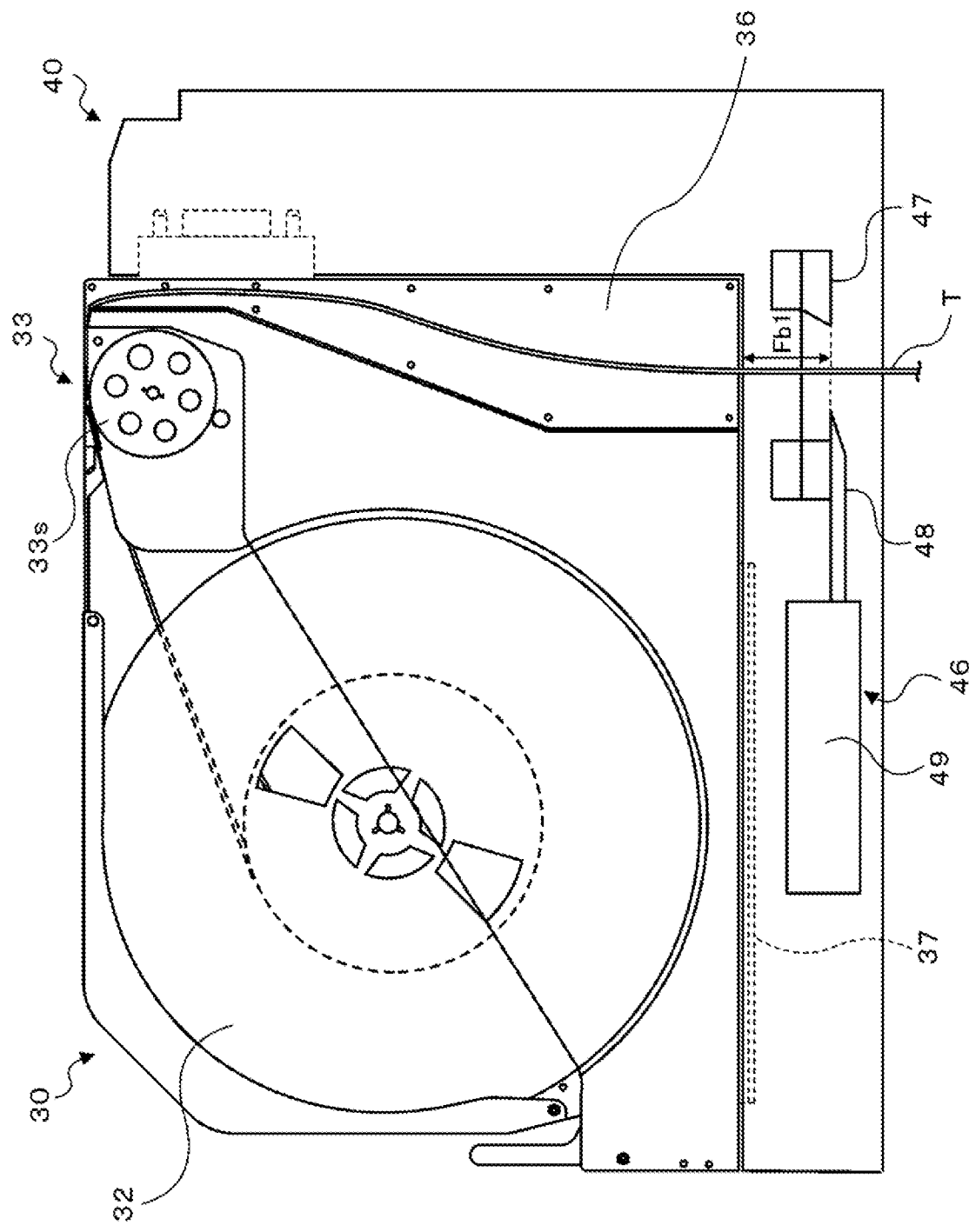
FIG. 4 is a schematic configuration diagram of feeder 30 and feeder base 40.
Figure 5:
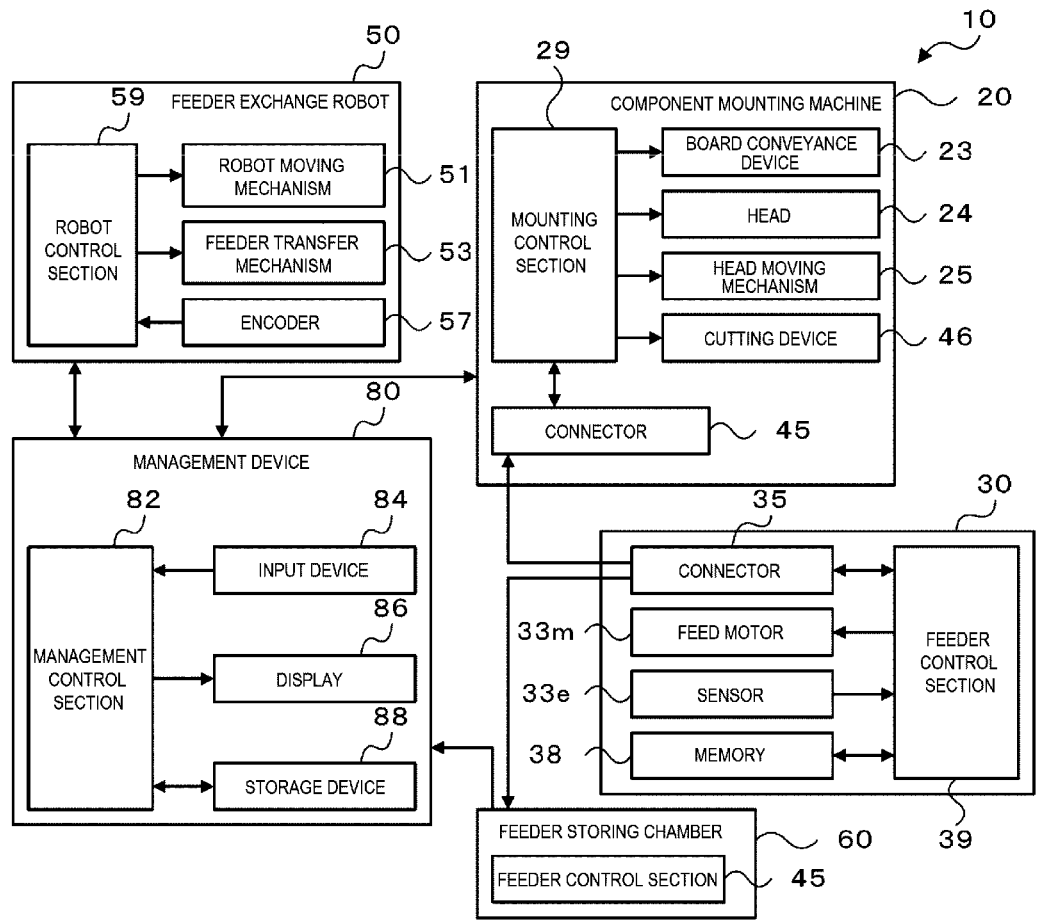
FIG. 5 is a block diagram showing an electrical connection relationship of component mounting system 10.

FIG. 1 is an appearance perspective view of component mounting system 10 in the present embodiment. FIG. 2 is a schematic configuration diagram of component mounting machine 20. FIG. 3 is an appearance perspective view of feeder 30. FIG. 4 is a schematic configuration diagram of feeder 30 and feeder base 40. FIG. 5 is a block diagram showing an electrical connection relationship of component mounting system 10. In FIG. 1 and FIG. 2, a left-right direction is set as an X-axis direction, a front-rear direction is set as a Y-axis direction, and an up-down direction is set as a Z-axis direction.

As shown in FIG. 1, component mounting system 10 includes printing device 12, print inspection device 14, multiple component mounting machines 20, mount inspection device (not shown), feeder exchange robot 50, feeder storing chamber 60, and management device 80 that manages the entire system. Printing device 12 is a device for printing solder on board S. Print inspection device 14 is a device for inspecting a state of the solder printed by printing device 12. Component mounting machines 20 are devices that are aligned along the conveyance direction (X-axis direction) of board S, and mount the components supplied from feeder 30 on board S. The mount inspection device is a device that inspects a mounting state of the components mounted by component mounting machine 20. Printing device 12, print inspection device 14, component mounting machine 20, and mount inspection device are installed side by side in the conveyance direction of board S in this order to form a production line. Feeder exchange robot 50 can move along the production line, and can replenish feeder 30 necessary for multiple component mounting machines 20, or collect used feeder 30 or feeder 30 that is no longer scheduled to be used from component mounting machine 20. Feeder storing chamber 60 is incorporated in the production line and stores multiple feeders 30.

As shown in FIG. 2, component mounting machine 20 includes mounting machine body 21 and feeder 30 that can be attached to and removed from mounting machine body 21. Mounting machine body 21 includes board conveyance device 23 that conveys board S from left to right, head 24 having a suction nozzle that picks up the components supplied by feeder 30, head moving mechanism 25 that moves head 24 in the front-rear direction and the left-right direction (XY direction), and mounting control section 29 (refer to FIG. 5) that controls the entire device. Board conveyance device 23, head 24, and head moving mechanism 25 are disposed in housing 22a provided on base 22b. Mounting control section 29 is configured with a well-known CPU, ROM, RAM, and the like, and outputs a drive signal to board conveyance device 23, head 24 and head moving mechanism 25, and the like.

As shown in FIG. 3 to FIG. 5, feeder 30 is a rectangular cassette type tape feeder, and includes tape reel 32, tape feeding mechanism 33, connector 35, empty tape passage 36, rail member 37, memory 38, and feeder control section 39. Tape T is wound around tape reel 32. Tape T has recess portions formed at a predetermined interval along the longitudinal direction, and each recess portion accommodates a component. The components are protected by a film covering the surface of tape T. Tape feeding mechanism 33 is a mechanism for pulling out and feeding out tape T from tape reel 32, and includes sprocket 33s in which engagement protrusions that engage with engagement holes (not shown) provided at equal intervals on tape T are provided on the outer circumference thereof, and feed motor 33m that can drive sprocket 33s in both forward and backward rotation directions. In addition, tape feeding mechanism 33 also includes sensor 33e such as a magnetic sensor that detects rotational position (sprocket position) θ of sprocket 33s. Feeder 30 drives feed motor 33m so that sprocket 33s rotates by a rotation amount corresponding to the accommodation pitch of component P, and sequentially supplies the components accommodated in tape T to a component supply position by feeding out tape T engaged with sprocket 33s by a predetermined feeding amount at each time. The components accommodated in tape T are in a state of being exposed at the component supply position due to the film being peeled off before the component supply position, and can be picked up by the suction nozzle. Connector 35 includes two positioning pins 34 protruding in the attachment direction. Empty tape passage 36 is a passage for discharging tape T (hereinafter, also referred to as empty tape T) from which the component is taken out at the component supply position downward, through a space between connector 35 and sprocket 33s. Rail member 37 is provided at the lower end of feeder 30 and extends in the attachment direction. Memory 38 is, for example, a non-volatile memory such as EEPROM, and stores cumulative feeding amount F of tape T, initial rotational position θ0, and the like, as will be described later. Feeder control section 39 is configured with a well-known CPU, ROM, RAM, and the like, and rotational position θ of sprocket 33s detected by sensor 33e is input, and the drive signal to feed motor 33m of tape feeding mechanism 33 is output. In addition, feeder control section 39 can communicate with the control section (mounting control section 29, management control section 82, and the like) to which feeder 30 is attached, via connector 35.

In addition, as shown in FIG. 2, multiple feeders 30 are detachably held on feeder base 40 provided in front surface of housing 22a of mounting machine body 21 so as to be arranged in the X-axis direction. Feeder base 40 is an L-shaped base in a side view, and includes multiple slots 42, two positioning holes 44 corresponding to each slot 42, and connector 45 corresponding to each slot 42. Rail member 37 of feeder 30 is inserted into slot 42. Two positioning pins 34 of feeder 30 are inserted into two positioning holes 44, and feeder 30 is positioned at feeder base 40. Connector 45 is provided between two positioning holes 44 and is connected to connector 35 of feeder 30.

In addition, component mounting machine 20 is provided with cutting device 46 for cutting empty tape T hanging down from the exit of empty tape passage 36 at a bottom portion of feeder base 40 and below empty tape passage 36 of feeder 30. Cutting device 46 includes stationary blade 47, movable blade 48, and driving device 49 for driving movable blade 48. Cutting device 46 cuts empty tape T between stationary blade 47 and movable blade 48 by a shearing force of scissors by causing movable blade 48 to reciprocate toward stationary blade 47 by driving device 49. In the present embodiment, cutting device 46 is configured to cut empty tape T at a cutting position separated from a bottom surface of feeder 30 by a predetermined amount. The cut empty tape T is collected in dust box 28 disposed in base 22b supporting housing 22a. The cut empty tape T may be conveyed to the outside of the machine by a conveyor device provided along the production line on base 22b.

As shown in FIG. 1, feeder exchange robot 50 is movable along X-axis rail 16 provided on the front surface of multiple component mounting machines 20 and the front surface of feeder storing chamber 60 in parallel with the conveyance direction (X-axis direction) of the board. As shown in FIG. 5, feeder exchange robot 50 includes robot moving mechanism 51, feeder transfer mechanism 53, encoder 57, and robot control section 59. Robot moving mechanism 51 moves feeder exchange robot 50 along X-axis rail 16. Feeder transfer mechanism 53 transfers feeder 30 between component mounting machine 20 and feeder storing chamber 60. Encoder 57 detects a movement position of feeder exchange robot 50 in the left-right direction (X-axis direction). Robot control section 59 is configured with a well-known CPU, ROM, RAM, and the like, and a detection signal from encoder 57 is input and a drive signal is output to robot moving mechanism 51 and feeder transfer mechanism 53. Feeder exchange robot 50 moves to a position facing component mounting machine 20 by controlling robot moving mechanism 51 and feeder transfer mechanism 53, and attaches and detaches feeder 30 to and from feeder base 40 of component mounting machine 20. Feeder storing chamber 60 includes multiple feeder bases similar to feeder base 40 provided in component mounting machine 20. Feeder exchange robot 50 moves to a position facing feeder storing chamber 60 by controlling robot moving mechanism 51 and feeder transfer mechanism 53, and attaches and detaches feeder 30 to and from feeder base of feeder storing chamber 60.

Management device 80 is a general-purpose computer, and as shown in FIG. 5, includes management control section 82, input device 84 such as a keyboard and a mouse, display 86, and storage device 88. Management control section 82 is configured with a CPU, ROM, RAM, and the like, and input device 84, display 86, and storage device 88 are electrically connected to each other. Storage device 88 is an HDD or an SSD, and various information necessary for production is stored therein. In addition, management device 80 is connected to mounting control section 29 by wire so as to be able to communicate with each other, and exchanges various information with each component mounting machine 20. When feeder 30 is attached and removed to and from component mounting machine 20, management device 80 receives the attachment and detachment status from corresponding component mounting machine 20 and updates the feeder attachment information to the latest information. Furthermore, management device 80 is wirelessly and communicably connected to robot control section 59 so as to exchange various information. In addition, management device 80 is communicably connected to printing device 12, print inspection device 14, and each control device of mount inspection device so as to exchange various information. Management device 80 determines whether a setup change has occurred based on various information stored in storage device 88 and the mounting status received from mounting control section 29 of each component mounting machine 20, and if it is determined that the setup change has occurred, transmits a setup change instruction including attachment and detachment of feeder 30 to robot control section 59.

Here, the operator attaches feeder 30 to a work table (not shown) including a slot and a connector for power supply, and the like, and performs an external setup for setting new tape reel 32 on feeder 30. In the external setup, the operator pulls out tape T from tape reel 32, and operates an operation section of the work table in a state of being engaged with sprocket 33s to drive feed motor 33m. By driving feed motor 33m, when sprocket 33s rotates to a position before the supply position of first component of tape T and a position to the extent that tape T is not removed from sprocket 33s, the operator detaches feeder 30 from the work table assuming that the setting is completed. The operator attaches the setting-completed feeder 30 to the feeder base of feeder storing chamber 60 to store.

Figure 6:
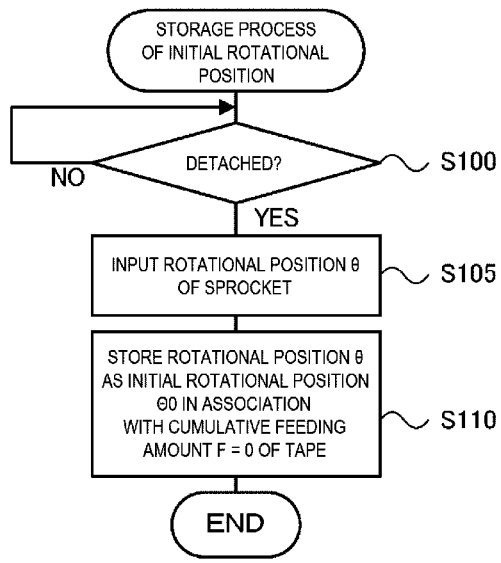
FIG. 6 is a flowchart showing an example of storage process of an initial rotational position.
Figure 7:
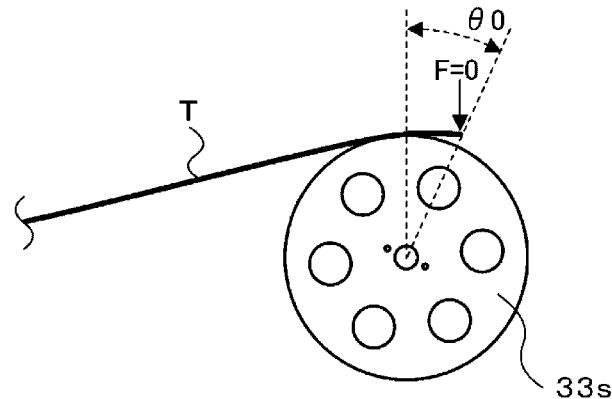
FIG. 7 is an explanatory diagram showing an example of initial rotational position θ0.

FIG. 6 is a flowchart showing an example of storage process of an initial rotational position. In this process, first, feeder control section 39 of feeder 30 waits for feeder 30 to be detached from the work table (S100). The power supply from the work table to feeder 30 detached from the work table is stopped, and thus, the voltage drops. Therefore, when it is determined that feeder 30 is detached from the work table by detecting the voltage drop, the feeder control section 39 inputs rotational position $\theta$ of sprocket 33s detected by sensor 33e (S105). Subsequently, feeder control section 39 stores the rotational position $\theta$ in memory 38 as initial rotational position $\theta 0$ in association with the initial set position of cumulative feeding amount F=0 of tape T (S110), and then, the storage process of the initial rotational position ends. FIG. 7 is an explanatory diagram showing an example of initial rotational position $\theta 0$. FIG. 7 shows a state in which sprocket 33s is rotated to a position before the supply position of the first component in tape T and a position to the extent that tape T is not removed from sprocket 33s. As shown in the drawing, the tip end position of tape T in this state is set to the position of cumulative feeding amount F=0, and the rotational position from the predetermined rotation reference is set to initial rotational position $\theta 0$.

Figure 8:
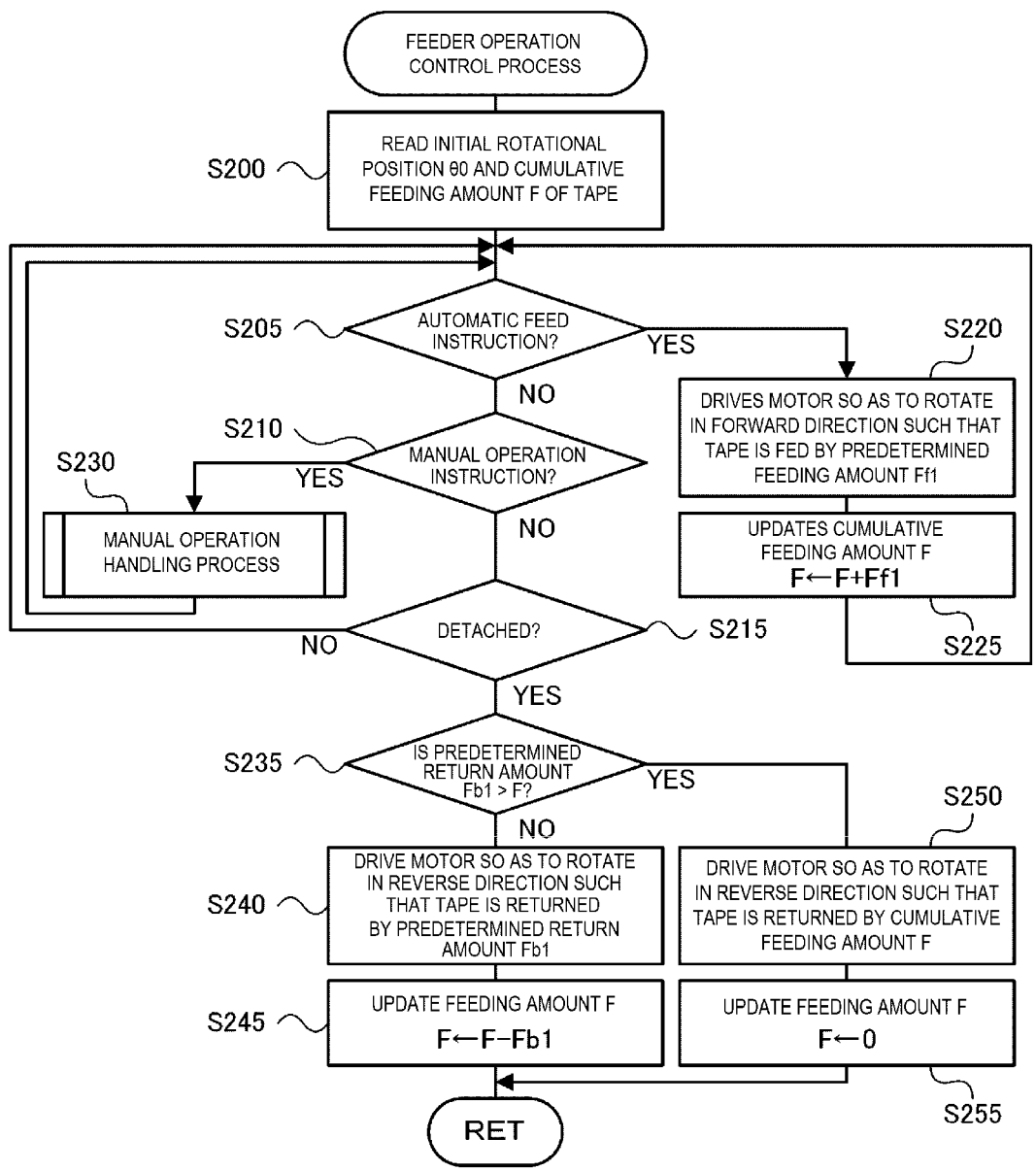
FIG. 8 is a flowchart illustrating an example of feeder operation control process.

The following description is a description for the operation of feeder 30. FIG. 8 is a flowchart illustrating an example of feeder operation control process. This process is executed by feeder control section 39 of feeder 30 attached to feeder base 40. In this process, first, feeder control section 39 reads initial rotational position $\theta 0$ and cumulative feeding amount F of the tape from memory 38 (S200). Next, feeder control section 39 determines whether an automatic feed instruction for the supply of the component is issued (S205), whether a manual operation instruction by the operator is issued (S210), and whether feeder 30 is detached from feeder base 40, via communication with mounting control section 29, respectively (S215).

When it is determined in S205 that the automatic feed instruction is issued, feeder control section 39 outputs a drive signal such that sprocket 33s feeds tape T by a predetermined feeding amount Ff1 corresponding to an accommodation interval of the component, and drives feed motor 33m to rotate in the forward direction (S220). In addition, feeder control section 39 updates cumulative feeding amount F by adding predetermined feeding amount Ff1 (S225), and the process returns to S205. Feeder control section 39 may update cumulative feeding amount F after confirming the completion of feeding as much as predetermined feeding amount Ff1 based on rotational position $\theta$ of sprocket 33s detected by sensor 33e. As described above, feeder control section 39 updates cumulative feeding amount F by adding predetermined feeding amount Ff1 each time tape T is fed as much as predetermined feeding amount Ff1. The manual operation instruction by the operator is performed to check the good or bad quality of the feeding operation and returning operation of tape T, and to check the stopping accuracy at the component supply position of tape T, but since it is rarely performed during the normal production, first, a case where feeder 30 is detached will be described.

In addition, when it is determined in S215 that feeder 30 is detached from feeder base 40, feeder control section 39 determines whether predetermined return amount (predetermined amount) Fb1 exceeds cumulative feeding amount F (S235). Here, when feeder 30 is detached from feeder base 40 by feeder exchange robot 50 or the operator, mounting control section 29 of component mounting machine 20 controls cutting device 46 to cut empty tape T hanging down from feeder 30 before the detachment. When cutting is completed, feeder control section 39 executes a rewinding operation by rotating sprocket 33s in the reverse direction to control feed motor 33m such that remaining empty tape T is rewound into feeder base 40. The rewinding amount required to rewind empty tape T hanging down outside feeder 30 into feeder 30 corresponds to, for example, a distance from the exit of empty tape passage 36 to the cutting position of cutting device 46, and is set to predetermined return amount Fb1. (refer to FIG. 4). In S235, feeder control section 39 compares predetermined return amount Fb1 with cumulative feeding amount F.

When it is determined in S235 that predetermined return amount Fb1 does not exceed cumulative feeding amount F, feeder control section 39 outputs a drive signal and drives feed motor 33m so as to rotate in the reverse direction such that sprocket 33s returns tape T by predetermined return amount Fb1 (S240). That is, when tape T is fed out in excess of predetermined return amount Fb1, feeder control section 39 rewinds tape T as much as predetermined return amount Fb1 to make a state in which empty tape T does not hang down from feeder 30. As a result, it is possible to prevent empty tape T from being pinched between feeder 30 and the feeder base when feeder 30 detached by feeder exchange robot 50 or the like is attached to the feeder base. Feeder control section 39 may update cumulative feeding amount F after confirming the completion of rewinding by predetermined return amount Fb1 based on rotational position θ of sprocket 33s detected by sensor 33e. Then, feeder control section 39 updates cumulative feeding amount F by subtracting predetermined return amount Fb1 (S245), and ends the feeder operation control process. Updated cumulative feeding amount F is stored in memory 38 at the time of detachment. In addition, the feeder operation control process is executed next, cumulative feeding amount F stored in memory 38 in the previous feeder operation control process is read out as latest cumulative feeding amount F in S200.

On the other hand, when it is determined in S235 that predetermined return amount Fb1 exceeds cumulative feeding amount F, feeder control section 39 outputs a drive signal and drives feed motor 33m so as to rotate in the reverse direction such that sprocket 33s returns tape T by cumulative feeding amount F (S250). That is, when the number of component supply is small and cumulative feeding amount F of tape T does not exceed predetermined return amount Fb1, feeder control section 39 rewinds tape T as much as cumulative feeding amount F. Therefore, feeder control section 39 controls feed motor 33m such that sprocket 33s does not rotate in the reverse direction in excess of initial rotational position θ0. Then, feeder control section 39 updates cumulative feeding amount F by subtracting cumulative feeding amount F, that is, by setting cumulative feeding amount F to a value 0 (S255), and ends the feeder operation control process. Feeder control section 39 may update cumulative feeding amount F after confirming that initial rotational position 80 has been reached (completion of rewinding of cumulative feeding amount F) based on rotational position θ of sprocket 33s detected by sensor 33e.

FIG. 9 is an explanatory diagram showing a state in which return is performed by predetermined return amount Fb1 in a comparison example and FIG. 10 is an explanatory diagram showing a state in which return is performed by cumulative feeding amount F in the present embodiment. Both FIG. 9A and FIG. 10A show initial rotational position θ0 when cumulative feeding amount F=0, which is the same state as in FIG. 7. In addition, both FIG. 9B and FIG. 10B show an example of a case where predetermined return amount Fb1 exceeds cumulative feeding amount F, and show a state of immediately before rewinding. As shown in FIG. 9, when predetermined return amount Fb1 exceeds cumulative feeding amount F, if the tape is returned by predetermined return amount Fb1, tape T is rewound in excess of the position of cumulative feeding amount F=0 (initial rotational position θ0). Therefore, as shown in FIG. 9C, tape T is removed from sprocket 33s, but feeder control section 39 cannot detect that tape T is removed from sprocket 33s. Therefore, feeder 30 is attached to feeder base 40 of component mounting machine 20 when used next time in a state in which tape T is kept removed. In that case, feeder 30 cannot properly supply the component, and a supply error may occur. The operator needs to stop the production by component mounting machine 20 and to detach feeder 30 to investigate the cause of the error. In addition, the operator needs to reset tape T to feeder 30 again. Therefore, it takes time for component mounting machine 20 to restart the production. On the other hand, in the present embodiment, as shown in FIG. 10, it is determined that predetermined return amount Fb1 exceeds cumulative feeding amount F in S235 of the feeder operation control process and only cumulative feeding amount F is returned, therefore, tape T returns to the position of cumulative feeding amount F=0 (initial rotational position θ0) (FIG. 10C). Therefore, as in the comparison example, since tape T is not removed from sprocket 33s, it is possible to prevent the component supply error from occurring and the operator from resetting tape T.

Figure 11:
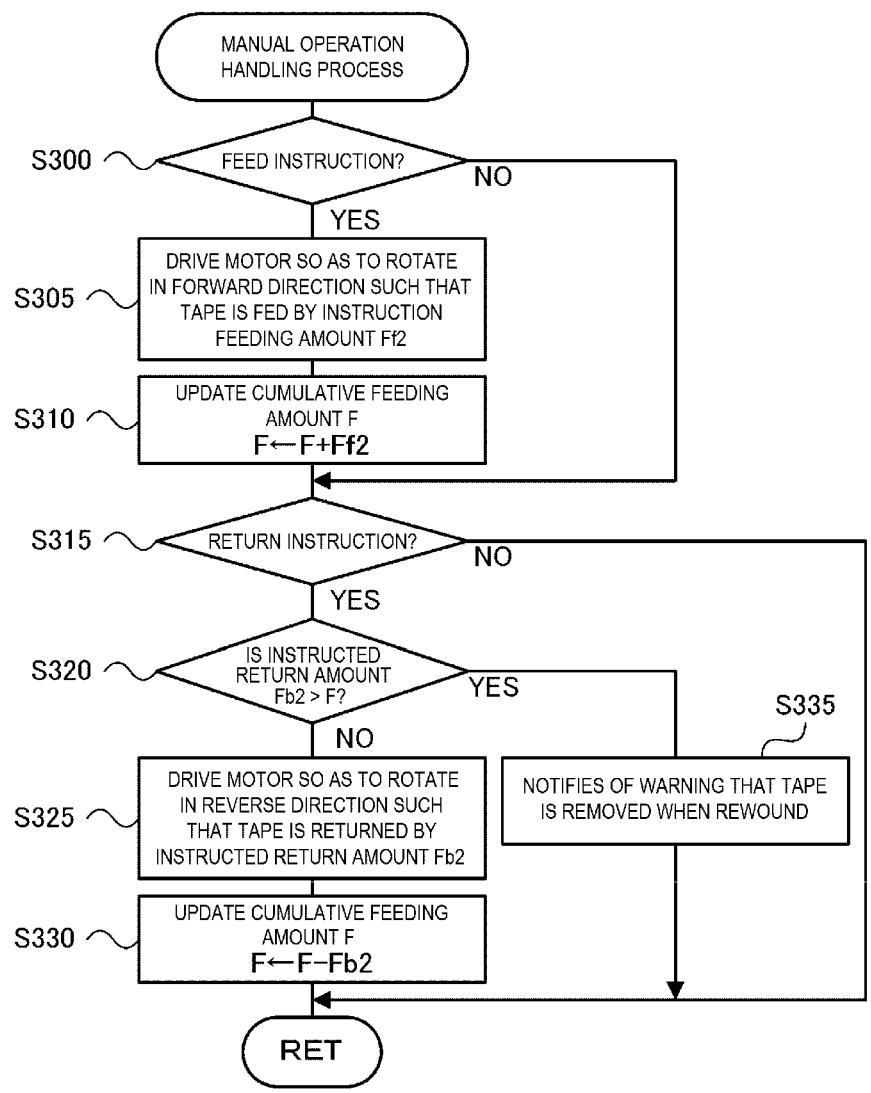
FIG. 11 is a flowchart showing an example of a manual operation handling process.

In addition, when it is determined that the manual operation instruction by the operator has been performed via the communication with mounting control section 29 in S210 of the feeder operation control process, feeder control section 39 executes the manual operation handling process shown in FIG. 11 (S230), and the process returns to S205. On the operation panel of component mounting machine 20, the operator can select feeder 30 attached to feeder base 40, and operate the feed instruction button for tape T of selected feeder 30, or the return instruction button for tape T and the like. In the manual operation handling process in FIG. 11, first, feeder control section 39 determines whether the manual operation instruction is a feed instruction (S300), and when it is determined that the manual operation instruction is not a feed instruction, the process proceeds to S315. Feeder control section 39 determines in S300 that, for example, the manual operation instruction is the feed instruction when the feed instruction button on the operation panel is operated one time, and outputs a drive signal to drive feed motor 33m so as to rotate in the forward direction such that sprocket 33s feeds tape T by instruction feeding amount Ff2 (S305). Then, feeder control section 39 updates cumulative feeding amount F by adding instruction feeding amount Ff2 (S310), and the process proceeds to S315. Instruction feeding amount Ff2 is predetermined as, for example, the feeding amount when the feed instruction button is operated one time.

Next, feeder control section 39 determines whether the manual operation instruction is a return instruction (S315), and when it is determined that the manual operation instruction is not a return instruction, ends the manual operation handling process. Feeder control section 39 determines that, for example, the manual operation instruction is a return instruction when the return instruction button on the operation panel is operated one time in S315, and determines whether instructed return amount Fb2 exceeds cumulative feeding amount F. (S320). Instructed return amount Fb2 is predetermined as, for example, the return amount when the return instruction button is operated one time. When it is determined in S320 that instructed return amount Fb2 does not exceed cumulative feeding amount F, feeder control section 39 outputs the drive signal and drives feed motor 33m so as to rotate in the reverse direction such that sprocket 33s returns tape T by instructed return amount Fb2 (S325). That is, when it is determined that tape T is fed in excess of instructed return amount Fb2, feeder control section 39 returns tape T as much as instructed return amount Fb2. As a result, it is possible to rewind tape T according to the instruction by the operator without tape T being removed from sprocket 33s. Then, feeder control section 39 updates cumulative feeding amount F by subtracting instructed return amount Fb2 (S330), and ends the manual operation handling process.

On the other hand, when it is determined in S320 that instructed return amount Fb2 exceeds cumulative feeding amount F, feeder control section 39 notifies of a warning that tape T is removed from sprocket 33s when tape T is returned (S335), and ends the manual operation handling process. The process in S335 is performed, for example, by providing a display section on feeder 30 or on mounting machine body 21, and by controlling the display section so as to display the warning that tape T is removed. As a result, it is possible to prevent tape T from being removed from sprocket 33s by the manual operation instruction by the operator.

Here, correspondence relationships between the configuration element in the present embodiment and the configuration element in the present disclosure will be clarified. Sprocket 33s in the present embodiment corresponds to a sprocket, feed motor 33m corresponds to a motor, feeder 30 corresponds to a feeder, sensor 33e corresponds to a sensor, memory 38 corresponds to a storage section, and feeder control section 39 corresponds to a control section. In addition, component mounting machine 20 corresponds to a component mounting machine, cutting device 46 corresponds to a cutting device, and mounting control section 29 corresponds to a control section.

Feeder 30 according to the embodiment described above stores the rotational position of sprocket 33s when tape T is set, in memory 38 as initial rotational position θ0, and stores cumulative feeding amount F of tape T fed by the rotation of sprocket 33s, in memory 38. In addition, when rewinding tape T, feed motor 33m is controlled based on initial rotational position θ0 and cumulative feeding amount F such that sprocket 33s does not rotate in the reverse direction in excess of initial rotational position θ0. As a result, when rewinding tape T when cumulative feeding amount F is small, it is possible to prevent tape T from being removed from sprocket 33s.

In addition, when feeder 30 is detached from component mounting machine 20, feeder control section 39 rewinds tape T by predetermined return amount Fb1 when predetermined return amount Fb1 does not exceed cumulative feeding amount F, and rewinds tape T by cumulative feeding amount F when predetermined return amount Fb1 exceeds cumulative feeding amount F. Therefore, feeder control section 39 can make a state in which tape T does not hang down outside feeder 30 when predetermined return amount Fb1 does not exceed cumulative feeding amount F. In addition, when predetermined return amount Fb1 exceeds cumulative feeding amount F, feeder control section 39 rotates sprocket 33s in the reverse direction up to initial rotational position θ0. Since initial rotational position θ0 is rotational position θ when tape T is set, it is possible to make a state of preventing tape T from being removed from sprocket 33s and preventing tape T from hanging down outside feeder 30.

In addition, when the rewind of tape T is instructed by the operator, feeder control section 39 rewinds tape T by instructed return amount Fb2 when instructed return amount Fb2 does not exceed cumulative feeding amount F, and notifies of a warning without rewinding tape T when instructed return amount Fb2 exceeds cumulative feeding amount F. In this way, feeder control section 39 can rewind the tape according to the instruction by the operator when instructed return amount Fb2 does not exceed cumulative feeding amount F. In addition, when instructed return amount Fb2 exceeds cumulative feeding amount F, feeder control section 39 can notify the operator of a fact that tape T cannot be rewound because tape T is removed, and thus, it is possible to prevent tape T from being removed.

It is needless to say that the present disclosure is not limited to the above-described embodiment and may be implemented in various forms as long as those forms fall within the technical scope of the present disclosure.

For example, in the embodiment described above, when the operator instructs to rewind tape T, a notification of a warning is issued without rewinding tape T when instructed return amount Fb2 exceeds cumulative feeding amount F, however, the configuration is not limited to this. For example, when instructed return amount Fb2 exceeds cumulative feeding amount F, tape T may be returned by cumulative feeding amount F without notifying of the warning. In addition, when instructed return amount Fb2 exceeds cumulative feeding amount F, tape T may not be rewound simply and the warning may not be issued. Alternatively, for the manual operation instruction by the operator, regardless of whether instructed return amount Fb2 exceeds cumulative feeding amount F, the instruction by the operator may be prioritized and tape T may be rewound, and the processes in S320 and S335 in the manual operation handling process may be omitted.

In the embodiment described above, feeder control section 39 may confirm the completion of the feeding operation and the return operation of tape T based on rotational position θ of sprocket 33s detected by sensor 33e, however, the configuration is not limited to this. For example, feeder control section 39 may stop feed motor 33m after detecting the completion of the feeding operation and the return operation based on rotational position θ of sprocket 33s detected by sensor 33e. For example, when returning tape T when predetermined return amount Fb1 exceeds cumulative feeding amount F, feeder control section 39 may drive feed motor 33m so as to rotate in the reverse direction, and then, feed motor 33m may be stopped when rotational position θ of sprocket 33s becomes initial rotational position θ0. That is, any process may be performed as long as feed motor 33m is controlled such that sprocket 33s does not rotate in the reverse direction in excess of initial rotational position θ0 based on initial rotational position θ0 and cumulative feeding amount F.

In the embodiment described above, in the feeder operation control process, predetermined return amount Fb1 and cumulative feeding amount F are compared each time when feeder 30 is detached, however, the configuration is not limited to this. For example, feeder control section 39 may perform the process in the same manner as in the embodiment until a predetermined condition is satisfied, and may rewind tape T, after the predetermined condition is satisfied, by omitting the processes in S235, S250, and S255 without comparing predetermined return amount Fb1 with cumulative feeding amount F. The predetermined condition may be any condition as long as it can be determined that tape T is sufficiently fed so that empty tape T hangs down outside feeder 30. For example, the predetermined condition may be a condition in which cumulative feeding amount F reaches predetermined feed threshold value Fref, or may be a condition in which the number of times that tape T is detached from feeder base 40 since tape T is set in feeder 30 reaches a predetermined number of times.

In the embodiment described above, component mounting machine 20 executes a cutting operation for cutting tape T prior to the detachment of feeder 30, and then, rewinds tape T, however, the configuration is not limited to this, and tape T may be rewound without executing the cutting operation. In that case, the rewinding amount of tape T may be determined based on the feeding amount of tape T since cutting device 46 executed the previous cutting operation. That is, predetermined return amount Fb1 set in advance is used as the return amount of tape T when feeder 30 is detached, a return amount required to return tape T hanging down outside feeder 30 to inside of feeder 30 at the time of detachment may be determined.

Here, the feeder in the present disclosure may be configured as follows. For example, in the feeder in the present disclosure, the control section may be configured to compare a predetermined amount required to rewind the tape hanging down outside the feeder into the feeder with the cumulative feeding amount when the feeder is detached from the component mounting machine, control the motor such that the tape is rewound by the predetermined amount when the predetermined amount does not exceed the cumulative feeding amount, and control the motor such that the tape is rewound by the cumulative feeding amount when the predetermined amount exceeds the cumulative feeding amount. In this way, when the predetermined amount does not exceed the cumulative feeding amount, the tape can be rewound by a predetermined amount so as to make a state in which tape does not hang down outside the feeder. In addition, when the tape is rewound by the cumulative feeding amount when the predetermined amount exceeds the cumulative feeding amount, the sprocket is rotated in the reverse direction to the initial rotational position. Since the initial rotational position is the rotational position when the tape is set with engagement to the sprocket, it is possible to prevent the tape from being removed from the sprocket, and to make a state of preventing the tape from hanging down outside the feeder.

In the feeder in the present disclosure, the control section may be configured to compare, when an instruction for rewinding the tape is issued by an operator, an instruction amount of rewinding which is based on the instruction with the cumulative feeding amount control the motor such that the tape is rewound by the instruction amount when the instruction amount does not exceed the cumulative feeding amount, and notify of a predetermined warning without rewinding the tape when the instruction amount exceeds the cumulative feeding amount. In this way, when the instruction amount does not exceed the cumulative feeding amount, it is possible to rewind the tape according to the instruction by the operator. In addition, when the instruction amount exceeds the cumulative feeding amount, a predetermined warning can be notified, and thus, it is possible to notify the operator of a fact that the tape cannot be rewound because the tape is removed from the sprocket.

A component mounting machine in the present disclosure to which any one of feeders described above is detachably attached, and that mounts the components supplied from the feeder on a target object, the machine includes: a cutting device configured to cut the tape fed to the outside of the feeder after supplying the components at a position where the tape hangs down from the feeder by a predetermined amount; and a control section configured to control the feeder so as to make a state in which the tape does not hang down outside the feeder when the feeder is detached.

Since any of the feeders described above can be detachably attached to the component mounting machine in the present disclosure, even when the tape does not hang down outside the feeder when the feeder is detached, it is possible to make a state of preventing the tape from being removed from the sprocket.

INDUSTRIAL APPLICABILITY

The present disclosure is applicable to a manufacturing industry of feeders and component mounting machines, and the like.

REFERENCE SIGNS LIST

10 component mounting system, 12 printing device, 14 print inspection device, 16 X-axis rail, 20 component mounting machine, 22a housing, 23 board conveyance device, 24 head, 25 head moving mechanism, 28 dust box, 29 mounting control section, 30 feeder, 32 tape reel, 33 tape feeding mechanism, 33s sprocket, 33m feed motor, 33e sensor, 34 positioning pin, 35 connector, 36 empty tape passage, 37 rail member, 38 memory, 39 feeder control section, 40 feeder base, 42 slot, 44 positioning hole, 45 connector, 46 cutting device, 47 stationary blade, 48 movable blade, 49 driving device, 50 feeder exchange robot, 51 robot moving mechanism, 53 feeder transfer mechanism, 57 encoder, 59 robot control section, 60 feeder storing chamber, 80 management device, 82 management control section, 84 input device, 86 display, 88 storage device, S board, T tape

The invention claimed is:

1. A feeder that includes a sprocket that feeds a tape accommodating multiple components and a motor that rotates the sprocket, and is detachably attached to a component mounting machine, the feeder comprising:
    a sensor configured to detect a rotational position of the sprocket;
    a storage section configured to store the rotational position of the sprocket detected by the sensor as an initial rotational position when the tape is set in the feeder with engagement to the sprocket and store a cumulative feeding amount of the tape fed by the rotation of the sprocket in a first direction, and
    a control section configured to
        control the motor such that the sprocket rotates in the first direction based on a feeding amount of the tape required for a supply when supplying the components to the component mounting machine,
        determine if the feeder is detached from the component mounting machine,
        when the feeder is detached from the component mounting machine,
            compare the cumulative feeding amount of the tape to a predetermined amount, and
            control the motor such that the sprocket rotates in a second direction to rewind the tape by the predetermined amount when the predetermined amount does not exceed the cumulative feeding amount, and control the motor such that the sprocket rotates in the second direction to rewind the tape by the cumulative feeding amount when the predetermined amount exceeds the cumulative feeding amount.

2. The feeder according to claim 1,
    wherein the predetermined amount is an amount required to rewind the tape hanging down outside the feeder into the feeder.

3. The feeder according to claim 1,
    wherein the control section is configured to, when an instruction for rewinding the tape is issued by an operator, compare an instruction amount of rewinding which is based on the instruction with the cumulative feeding amount, control the motor such that the sprocket rotates in the second direction to rewind the tape by the instruction amount when the instruction amount does not exceed the cumulative feeding amount, and notify of a predetermined warning without rewinding the tape when the instruction amount exceeds the cumulative feeding amount.

4. A component mounting machine to which the feeder according to claim 1 is detachably attached, and that mounts components supplied from the feeder on a target object, the machine comprising:

a cutting device configured to cut the tape fed to an outside of the feeder after supplying the components at a position where the tape hangs down from the feeder by a predetermined amount, and
a control section configured to control the feeder so as to make a state in which the tape does not hang down outside the feeder when the feeder is detached.

\* \* \* \* \*